United States Patent
Lim et al.

[11] Patent Number: 6,093,628
[45] Date of Patent: Jul. 25, 2000

[54] ULTRA-LOW SHEET RESISTANCE METAL/POLY-SI GATE FOR DEEP SUB-MICRON CMOS APPLICATION

[75] Inventors: Chong Wee Lim; Kin Leong Pey; Soh Yun Siah; Eng Hwa Lim, all of Singapore, Singapore; Lap Chan, San Francisco, Calif.

[73] Assignees: Chartered Semiconductor Manufacturing, Ltd; National University of Singapore, both of Singapore, Singapore

[21] Appl. No.: 09/165,003

[22] Filed: Oct. 1, 1998

[51] Int. Cl.⁷ ............... H01L 21/4763; H01L 21/3205; H01L 21/28; H01L 21/44
[52] U.S. Cl. .................. 438/592; 438/586; 438/687; 438/585; 438/597; 438/571; 438/582
[58] Field of Search .................. 438/592, 586, 438/687, 585, 597, 595, 571, 573, 582

[56] References Cited

U.S. PATENT DOCUMENTS

| | | | |
|---|---|---|---|
| 4,931,411 | 6/1990 | Tigelaar et al. | 437/192 |
| 5,447,874 | 9/1995 | Grivna et al. | 437/40 |
| 5,641,983 | 6/1997 | Kato et al. | 257/412 |
| 5,731,239 | 3/1998 | Wong et al. | 438/296 |
| 5,861,340 | 1/1999 | Bai et al. | 438/592 |
| 5,899,740 | 5/1999 | Kwon | 438/627 |

Primary Examiner—Wael Fahmy
Assistant Examiner—Neal Berezny
Attorney, Agent, or Firm—George O. Saile; Rosemary L.S. Pike; William J. Stoffel

[57] ABSTRACT

A method for fabricating a deep sub-micron gate electrode, comprising polysilicon and metal, having ultra-low sheet resistance. The process begins by forming shallow trench isolation regions 14 in a silicon substrate 10. A gate oxide layer is formed on device areas. A doped blanket polysilicon layer 16 is formed on the gate oxide layer. A cap layer 20 composed of silicon nitride is formed on the polysilicon layer 16. The cap layer 20 and the polysilicon layer 16 are patterned by photoresist masking and anisotropic etching to form a bottom gate electrode 16A and a gate cap 20A. Lightly doped source/drain areas 22 are formed adjacent to the gate bottom electrodes 16A by ion implantation. Sidewall spacers 21 are formed on the gate electrode 16A and gate cap 20A. Source/drain regions 24 are formed by ion implantation adjacent to said sidewall spacers 21. A metal silicide 23 is formed on the source/drain regions 24. An interlevel dielectric layer (ILD) 28 is deposited and planarized by CMP using the gate cap 20A as a CMP stop. The gate cap 20 is selectively removed. A barrier layer 32 composed of a TaN, CoWP, TiN or $W_xN_y$ is formed over the planarized IDL 28A. A top gate layer 36 composed of copper or tungsten is formed on the barrier layer 32. The top gate layer 36 and the barrier layer 32 are removed down to the level of the top of the ILD 28 using CMP; thereby forming a top gate electrode. A passivation layer 40, composed of Pd or NiP is selectively deposited over the gate top electrode 36A.

19 Claims, 2 Drawing Sheets

ULTRA-LOW SHEET RESISTANCE METAL/ POLY-SI GATE FOR DEEP SUB-MICRON CMOS APPLICATION

BACKGROUND OF INVENTION

1) Field of the Invention

The present invention relates to the fabrication of integrated circuit devices on semiconductor substrates, and more particularly to a method for making deep sub-micron gate electrodes by using a self-aligned mask to selectively form a low resistance metal layer over a polysilicon layer.

2) Description of the Prior Art

Advances in the semiconductor process technologies in recent years have dramatically decreased the device feature size and increased the circuit density and performance on integrated circuit chips. The field effect transistor (FET) is used extensively for Ultra Large Scale Integration (ULSI). These FETs are formed using polysilicon gate electrodes and self-aligned source/drain contact areas.

Conventional FETs are typically fabricated by patterning polysilicon gate electrodes over a thin gate oxide on a single crystal semiconductor substrate. The gate electrode structure is used as a diffusion or implant barrier mask to form self-aligned source/drain areas in the substrate adjacent to the sides of the gate electrode. The distance from the source junction to drain junction under the gate electrode is defined as the channel length of the FET.

Advances in semiconductor technologies, such as high resolution photolithographic techniques and anisotropic plasma etching, to name a few, have reduced the minimum feature sizes on devices to less than a quarter-micrometer. For example, FETs having gate electrodes with widths less than 0.35 micrometers (um), and channel lengths that are less than the gate electrode width are currently used in the industry.

However, as this downscaling continues and the channel length is further reduced, the FET device experiences a number of undesirable electrical characteristics. One problem associated with these narrow gate electrodes is the high electrical sheet resistance which impairs the performance of the integrated circuit.

One method of circumventing this problem is to form on the gate electrode a metal silicide layer that substantially reduces the sheet resistance of the polysilicon gate electrode, and also the local electrical interconnecting lines made from the same polysilicon layer. A typical approach is to use a salicide process. In this process the polysilicon gate electrodes are patterned over the device areas on the substrate. Insulating sidewall spacers are formed on the sidewalls of the gate electrodes, and source/drain areas are implanted adjacent to the gate electrodes. Using the salicide process, a metal is deposited over the polysilicon gate electrodes and the self-aligned source/drain areas, and sintered to form a silicide layer on the polysilicon gates and silicide contacts in the source/drain areas. The unreacted metal on the insulating layer is selectively removed. Unfortunately, the formation of these salicide gate electrodes can result in undesirable effects, such as residual metal or silicide stringers extending over the narrow spacers causing electrical shorts between the gate electrodes and the source/drain areas.

A second problem results from forming titanium silicide on sub-quarter-micrometer FETs. The problem is that it is difficult to form low sheet resistance silicide on these sub-0.25-micrometer (um) gate lengths. One method to circumvent this problem is to use a cobalt or a nickel silicide to replace the titanium silicide. An alternative method to improve the sheet resistance is to amorphize the polysilicon layer by ion implantation prior to forming the titanium silicide.

The importance of overcoming the various deficiencies noted above is evidenced by the extensive technological development directed to the subject, as documented by the relevant patent and technical literature. The closest and apparently more relevant technical developments in the patent literature can be gleaned by considering:

U.S. Pat. No. 5,731,239(Wong)
U.S. Pat. No. 4,931,411(Tigelaar)
U.S. Pat. No. 5,447,874(Grivna)
U.S. Pat. No. 5,641,983(Kato)

SUMMARY OF THE INVENTION

It is an object of the present invention to provide a method to form an ultra-low sheet resistance metal gate while preserving the gate oxide material integrity.

It is another object of the present invention to provide a method of manufacturing sub-micron CMOS devices with an ultra low-sheet resistance gate.

It is another object of the present invention to provide a method of manufacturing an ultra-low sheet resistance gate by forming a top gate electrode 36A composed of metal.

It is another object of the present invention to provide a method of manufacturing sub-micron CMOS devices that eliminates the narrow line-width effect and doping effect associated with silicide formation on a narrow polysilicon gate.

It is another object of the present invention to provide a method of manufacturing a CMOS gate that can be selectively passivated, thereby reducing RC delay.

It is yet another object of the present invention to provide an economical and robust method of manufacturing sub-micron CMOS devices.

To accomplish the above objectives, the present invention provides a method of manufacturing an ultra-low sheet resistance gate electrode comprising a top gate electrode 36A composed of metal and a bottom electrode 16A composed of polysilicon or amorphous silicon. The invention also forms silicide source/drain contacts 23. The process begins by forming shallow trench isolation regions 14 in a silicon substrate 10. A gate oxide layer (not shown) is formed on device areas. A bottom gate electrode layer 16 composed of non-monocrystaline silicon is formed on the gate oxide layer. A cap layer 20 composed of silicon nitride or silicon oxynitride is formed on the bottom gate electrode layer 16. The cap layer 20 and the bottom gate electrode layer 16 are patterned by photoresist masking and anisotropic etching to form a gate cap 20A and a bottom gate electrode 16A. Lightly doped source/drain areas 22 are formed adjacent to the gate bottom electrodes 16A by ion implantation. Sidewall spacers 21 are formed on the gate electrode 16A and gate cap 20A. Source/drain regions 24 are formed by ion implantation adjacent to said sidewall spacers 21. Metal silicide contacts 23 are formed on the source/drain regions 24. An interlevel dielectric layer (ILD) 28 is deposited and planarized by CMP using the gate cap 20A as a CMP stop. The gate cap 20 is selectively removed by wet etching. A barrier layer 32 composed of a TaN, CoWP, TiN or $W_xN_y$ is formed over the planarized IDL 28A, the bottom gate electrode 16A and the sidewall spacers 21. A top gate layer 36 composed of copper or tungsten is formed on the barrier layer 32. The top gate layer 36 and the barrier layer 32 are removed down to the level of the top of the ILD 28 using CMP; thereby forming a top gate electrode 36A. A passivation layer 40, composed of Pd or NiP is selectively deposited over the gate top electrode 36A.

BENEFITS

The present invention provides a method to form an ultra-low sheet resistance metal gate while preserving the gate oxide material integrity. A key advantage of the present invention is that the top gate electrode 36A and the bottom gate electrode 16A constitute a gate electrode 36A & 16A whereby the top gate electrode 36A composed of copper or tungsten reduces the resistance of the gate electrode 36A & 16A. The use of copper or tungsten for a gate conductor instead of silicides provides a significant reduction in sheet resistance. For example, copper has a sheet resistance of approximately 1.67 $\mu\Omega$-cm compared to 15 to 20 $\mu\Omega$-cm for titanium silicide.

Because copper and tungsten deposition and CMP techniques are in standard use, they can be easily and economically applied in the present invention. Removal of the cap after silicide formation on the source/drain provides a self-aligned recess for formation of the top gate electrode, eliminating alignment concerns.

By using copper or tungsten instead of a silicide as the gate conductor, the present invention provides a method of manufacturing sub-micron CMOS devices that eliminates the narrow line-width effect and doping effect associated with silicide formation on a narrow polysilicon gate. A Pd or NiP passivation layer can be selectively deposited over the top gate electrode 36A, thereby reducing RC delay.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method for fabricating an ultra-low sheet resistance gate electrode comprising non-monocrystaline silicon and metal.

Figure 1:
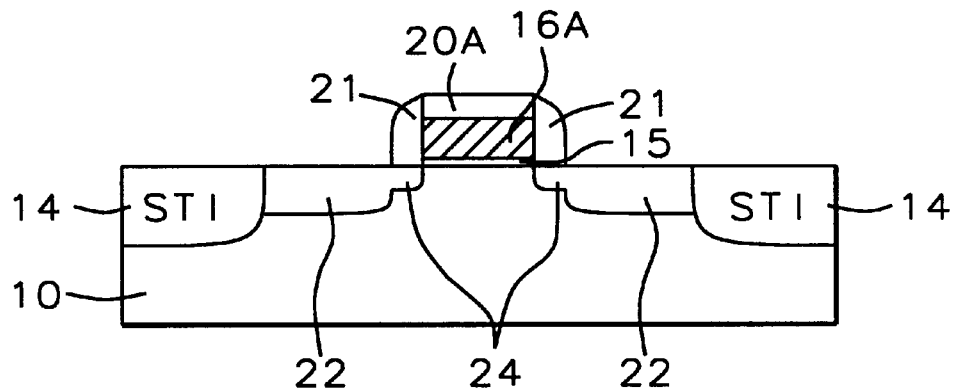
FIGS. 1, 2, 3, 4 and 5 are cross-sectional views for illustrating a method for manufacturing an ultra-low sheet resistance metal/polysilicon gate for CMOS applications.

Referring to FIG. 1, the process begins by forming shallow trench isolation regions 14 (STI) in a semiconductor substrate 10. The STIs surround and electrically isolate device areas. A gate oxide layer 15 is formed on the device areas. Then, a bottom gate electrode layer 16 is formed on the STIs 14 and on the gate oxide layer. The bottom gate electrode layer 16 can be composed of amorphous silicon ($\alpha$-Si) or most preferably polycrystaline silicon (poly-Si). The bottom gate electrode layer 16 can be formed using low pressure chemical vapor deposition (LPCVD) by reacting silane at 500° C. to 700° C. Then, the poly-Si (or $\alpha$-Si) is doped by implanting N+ ions or P+ ions, such as arsenic, phosphorous or boron. Alternately, the poly-Si (or $\alpha$-Si) can be doped in situ by adding a dopant gas such as arsine or phosphine during deposition. Preferably, the bottom gate electrode layer 16 is composed of poly-Si doped with arsenic and has a dopant concentration of between about 1.2 E 20 and 2.8 E 20 atoms/cm$^3$ and a thickness of between about 1000 and 3000 Angstroms.

A cap layer 20 is formed on the bottom gate electrode layer 16. The cap layer 20 can be composed of silicon nitride or silicon oxynitride, and is preferably composed of silicon nitride. Silicon nitride can be deposited by reacting dichlorosilane and ammonia using LPCVD at a temperature in the range between 700° C. and 800° C. to a thickness in the range between about 1000 Å and 3000 Å.

The cap layer 20 and the bottom gate electrode layer 16 are patterned by photoresist masking and anisotropic etching leaving portions over the device areas of the substrate 10 to form a bottom gate electrode 16A with a gate cap 20A thereover. The bottom gate electrode 16A is patterned to have a width of less than about 0.25 $\mu$m.

Lightly doped source/drain regions 22 are formed adjacent to the bottom gate electrode 16A by using ion implantation of an N-type dopant species such as arsenic or phosphorus or a P-type dopant species such as boron. A typical lightly doped source/drain region 22 can be formed by implanting phosphorous ions at a dose of between about 1.0 E 13 atoms/cm$^2$ and 1.0 E 14 atoms/cm$^2$ at an energy level of between about 15 KeV and 80 KeV.

Sidewall spacers 21 are formed along the bottom gate electrode 16A and gate cap 20A, having a width in a range of between about 0.05 $\mu$m and 1.2 $\mu$m. The sidewall spacers 21 are composed of silicon nitride and/or silicon oxide. The sidewall spacers 21 are preferably formed by depositing a first insulating layer over the bottom gate electrode 16A, the gate cap 20A, and elsewhere on the substrate, then anisotropically etching back the first insulating layer. Source/drain regions 24 are formed by ion implantation adjacent to the sidewall spacers 21. Preferably, arsenic ions are implanted at a dose of between about 1.0 E 15 atoms/cm$^2$ and 1.0 E 16 atoms/cm$^2$ at an energy between about 20 KeV and 70 KeV.

Figure 2:
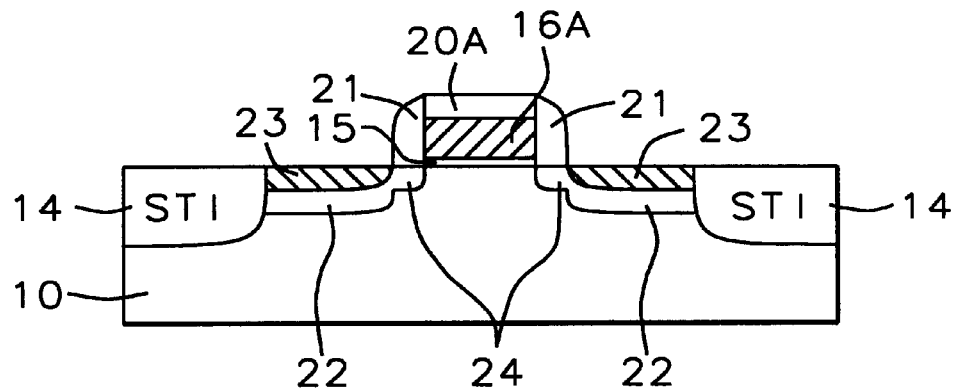

Referring to FIG. 2, a metal layer (e.g. Ti, Co, Pd, Ni, or a combination thereof) is blanket deposited and annealed to form silicide contacts 23 on the source/drain regions 22 while leaving, unreacted, the first metal layer on insulated surfaces. For example a first metal layer, composed of titanium, is deposited by a physical sputtering process to a thickness between about 10 Å and 350 Å. The first metal layer is annealed by rapid thermal annealing in a temperature range of between about 350° and 850° C. for a time of between about 20 and 60 seconds. The unreacted metal residue is then removed in a selective wet etch, such as deionized water, 30% hydrogen peroxide, and ammonium hydroxide.

Figure 3:
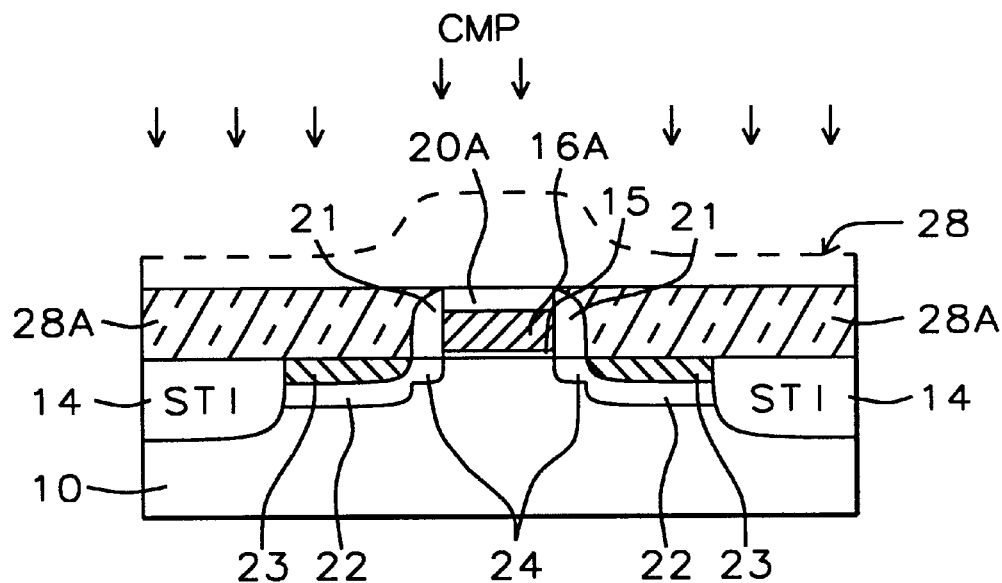

Referring to FIG. 3, an interlevel dielectric layer 28 (ILD) is deposited on the substrate 10 and over the gate bottom electrode 16A. Preferably, the ILD 28 is deposited to a thickness in a range of between about 5000 Å and 15000 Å by a LPCVD or PECVD process using a reactant gas such as tetraethoxysilane or tetraethylorthosilicate (TEOS). The ILD 28 is removed down to the gate cap 20A by a chemical/mechanical polishing process (CMP). The gate cap 20A acts as a CMP stop. After CMP, the ILD 28A has a thickness in a range of between about 2000 Å and 6000 Å.

Figure 4:
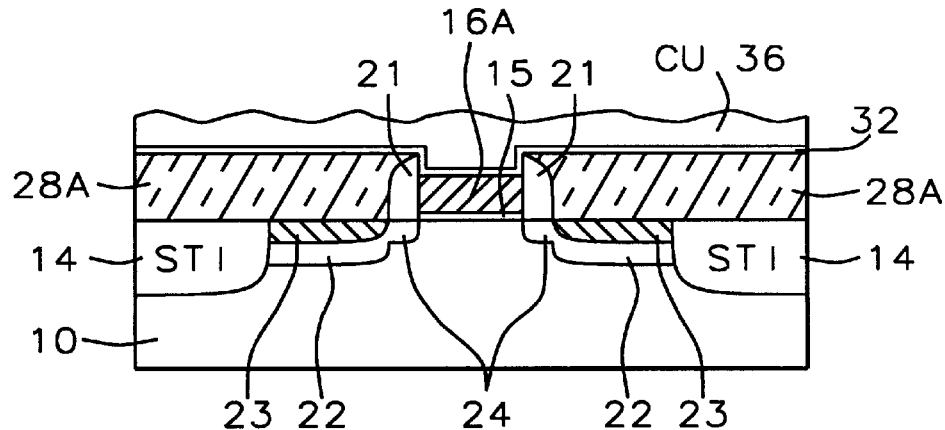

Referring to FIG. 4, the gate cap 20A is removed over the bottom gate electrode 16A by wet or dry etching. The gate cap 20A is preferably removed using a selective wet etch comprising hot phosphoric acid.

A barrier layer 32 is formed over the ILD 28A and the bottom gate electrode 16A. The barrier layer 32 can be composed of CoWP, TiN, $W_xN_y$ or most preferably TaN having a thickness in the range between about 50 Å and 500 Å. The barrier layer 32 can be formed using a PVD, sputtering, CVD, plating, or evaporation process.

Still referring to FIG. 4, a gate metal layer 36 is formed on the barrier layer 32 to a thickness of between about 200 Å and 2000 Å. The gate metal layer 36 can be composed of tungsten or most preferably copper. The gate metal layer 36 can be formed by a process of electroless deposition, galvonic deposition, CVD, elocroplating or PVD sputtering and is most preferably formed by a plating process.

Figure 5:
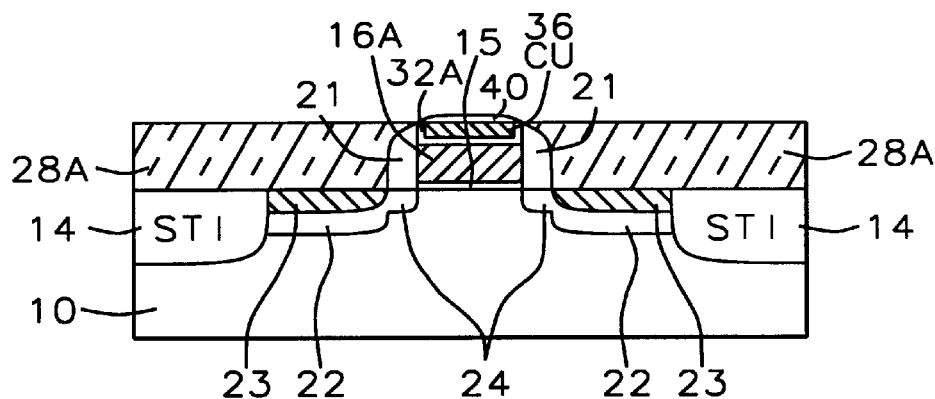

Referring to FIG. 5, the gate metal layer 36 and the barrier layer 32 are removed to the top of the IDL 28A using a CMP process. The gate metal layer 36 and barrier layer 32 remain over only the bottom gate electrode 16A between the sidewall spacers 21, with the gate metal layer 36 forming a top gate electrode 36A over the barrier layer 32A and the bottom gate electrode 16A.

Figure 6:
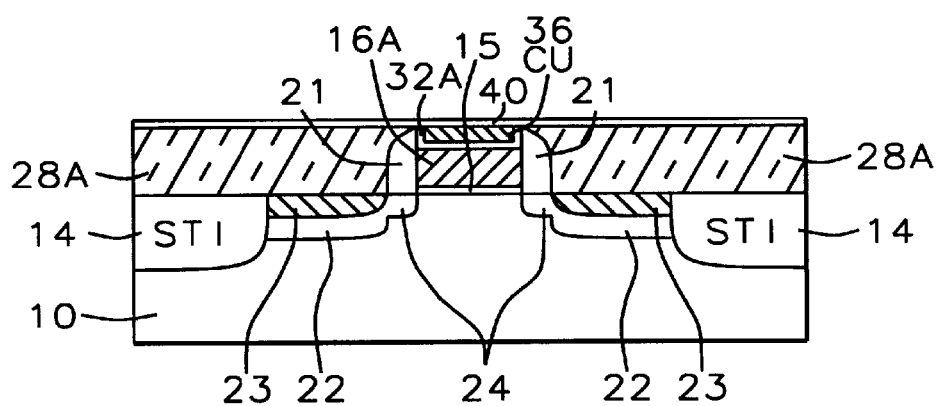
FIG. 6 is a cross-sectional view illustrating an alternate passivation layer.

A passivation layer 40 is selectively deposited over the top gate electrode 36A using an electroless plating, or CVD process. The passivation layer is preferably composed of Pd or NiP with a thickness in the range between about 50 Å and 500 Å. Alternately, the passivation layer can be composed of nitride or oxynitride blanket deposited over the ILD and the top gate electrode 36A to a thickness in the range between about 500 Å and 1500 Å as shown in FIG. 6.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an ultra-low sheet resistance gate electrode for CMOS applications; comprising the steps of:
   a) providing a semiconductor substrate having a gate oxide layer thereon, a bottom gate electrode over said gate oxide layer, a gate cap over said bottom gate electrode, a lightly doped source/drain region adjacent to said bottom gate electrode, sidewall spacers on said bottom gate electrode and said gate cap, source/drain regions adjacent to said sidewall spacers, suicide contacts on said source/drain regions, and an interlevel dielectric layer over said substrate, said gate oxide layer, said bottom gate electrode, said lightly doped source/drain region, said sidewall spacers, said source/drain regions, and said silicide contacts;
   b) chemical/mechanically polishing said interlevel dielectric layer down to the level of the top of said gate cap;
   c) selectively removing said gate cap;
   d) forming a barrier layer over said interlevel dielectric layer, said bottom gate electrode and said sidewall spacers;
   e) forming a top gate electrode layer on said barrier layer; said top gate electrode layer being composed of metal;
   f) removing said top gate electrode layer and said barrier layer down to the level of the top of said interlevel dielectric layer using chemical/mechanical polishing; thereby forming a gate electrode comprising a top gate electrode, a barrier layer and a bottom gate electrode;
   g) forming a passivation layer over said top gate electrode.

2. The method of claim 1 wherein said gate bottom electrode has a maximum width of 0.25 µm and a thickness in the range between about 1000 Å and 3000 Å.

3. The method of claim 1 wherein said top gate electrode layer is composed of copper or tungsten having a thickness of between about 200 Å and 2000 Å.

4. The method of claim 1 wherein said barrier layer is composed of TaN, CoWP or $W_xN_y$ having a thickness in the range between about 50 Å and 500 Å.

5. The method of claim 1 wherein said bottom gate electrode layer is composed of N+ polysilicon having a thickness in the range between about 1000 Å and 3000 Å; said polysilicon layer being doped with arsenic at a concentration of between about 1.2 E 20 and 2.8 E 20 atoms/cm$^3$.

6. The method of claim 1 wherein said silicide contacts are formed by depositing a metal layer comprising Ti, Co, Ni, Pd, or a combination thereof having a thickness between about 10 and 350 Angstroms; said metal layer being annealed by rapid thermal annealing at a temperature in the range of between about 350° C. and 850° C. for a time of between about 20 seconds and 60 seconds.

7. The method of claim 1 wherein said passivation layer is composed of a Pd or NiP selectively deposited on said top gate electrode having a thickness in the range between about 50 Å and 500 Å.

8. The method of claim 1 wherein said passivation layer is composed of $Si_3N_4$ or $SiO_xN_y$ blanket deposited over said top gate electrode and said interlevel dielectric layer.

9. The method of claim 1 wherein the gate cap acts a polish stop during chemical/mechanical polishing of said interlevel dielectric layer and said interlevel dielectric layer acts as a polishing stop during chemical/mechanical polishing of said top gate electrode layer and said barrier layer.

10. A method for fabricating an ultra-low sheet resistance gate electrode for CMOS applications; comprising the steps of:
   a) providing a semiconductor substrate;
   b) forming a gate oxide layer on said semiconductor substrate;
   c) depositing a non-monocrystalline silicon layer on said substrate;
   d) depositing a cap layer on said non-monocrystalline silicon layer;
   e) patterning said cap layer and said non-monocrystalline silicon layer to form a bottom gate electrode and a gate cap thereover;
   f) forming lightly doped source/drain regions adjacent to said gate bottom gate electrode;
   g) forming sidewall spacers on said gate bottom electrode and said gate cap;
   h) forming source/drain regions adjacent to said sidewall spacers;
   i) forming suicide contacts on said source/drain regions;
   j) depositing an interlevel dielectric layer over said substrate;
   k) chemical/mechanically polishing said interlevel dielectric layer down to the level of the top of said gate cap;
   l) selectively removing said gate cap;

m) forming a barrier layer over said interlevel dielectric layer, said bottom gate electrode and said sidewall spacers;

n) forming a top gate electrode layer on said barrier layer; said top gate electrode layer composed of copper or tungsten;

o) removing said top gate electrode layer and said barrier layer down to the level of the top of said interlevel dielectric layer using chemical/mechanical polishing; thereby forming a gate electrode comprising a top gate electrode, a barrier layer and a bottom gate electrode;

p) forming a passivation layer over said top gate electrode.

11. The method of claim 10 wherein said gate bottom electrode has a maximum width of 0.25 µm and a thickness in the range between about 1000 Å and 3000 Å.

12. The method of claim 10 wherein said barrier layer is composed of TaN, CoWP or $W_xN_y$ having a thickness in the range of between about 50 Å and 500 Å.

13. The method of claim 10 wherein said bottom gate electrode layer is composed of N+ polysilicon having a thickness in the range between about 1000 Å and 3000 Å; said polysilicon layer being doped with arsenic at a concentration of between about 1.2 E 20 and 2.8 E 20 atoms/cm$^3$.

14. The method of claim 10 wherein said silicide contacts are formed by depositing a metal layer comprising Ti, Co, Ni, Pd, or combination thereof having a thickness between about 10 and 350 Angstroms; said metal layer being annealed by rapid thermal annealing at a temperature in the range of between about 350° C. and 850° C. for a time of between about 20 seconds and 60 seconds.

15. The method of claim 10 wherein said passivation layer is composed of a Pd or NiP selectively deposited on said top gate electrode having a thickness in the range between about 50 Å and 500 Å.

16. The method of claim 10 wherein said passivation layer is composed of $Si_3N_4$ or $SiO_xN_y$ blanket deposited over said top gate electrode and said interlevel dielectric layer.

17. The method of claim 10 wherein the gate cap acts a CMP stop during polishing of said interlevel dielectric layer and said interlevel dielectric layer acts as a polish stop during chemical/mechanical polishing of said top gate electrode layer and said barrier layer.

18. The method of claim 10 wherein said gate cap has a thickness in the range between about 1000 Å and 2000 Å.

19. The method of claim 10 wherein said gate cap is selectively removed using a wet etch comprising hot phosphoric acid.

* * * * *